(12) United States Patent
Chakravarti et al.

(10) Patent No.: US 8,680,651 B2
(45) Date of Patent: Mar. 25, 2014

(54) NANOPILLAR DECOUPLING CAPACITOR

(75) Inventors: Satya N. Chakravarti, Hopewell Junction, NY (US); Dechao Guo, Fishkill, NY (US); Huiming Bu, Millwood, NY (US); Keith Kwong Hon Wong, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/530,549

(22) Filed: Jun. 22, 2012

(65) Prior Publication Data

US 2012/0256294 A1    Oct. 11, 2012

Related U.S. Application Data

(63) Continuation of application No. 12/548,298, filed on Aug. 26, 2009, now Pat. No. 8,258,037.

(51) Int. Cl.
*H01L 29/02* (2006.01)
*H01L 21/02* (2006.01)

(52) U.S. Cl.
USPC .............. 257/532; 438/396; 257/E29.002; 257/E21.008

(58) Field of Classification Search
USPC .......... 257/532, E29.002, E21.008; 438/396
See application file for complete search history.

(56) References Cited

U.S. PATENT DOCUMENTS

| | | | |
|---|---|---|---|
| 5,486,277 A | 1/1996 | Barbee, Jr. et al. | |
| 6,709,929 B2* | 3/2004 | Zhang et al. | 438/268 |
| 6,794,704 B2 | 9/2004 | Yates et al. | |
| 6,946,356 B2* | 9/2005 | Shin et al. | 438/381 |
| 7,008,853 B1 | 3/2006 | Dupont et al. | |
| 7,084,002 B2 | 8/2006 | Kim et al. | |
| 7,102,204 B2 | 9/2006 | Berndlmaier et al. | |
| 7,148,555 B2 | 12/2006 | Yates et al. | |
| 7,241,695 B2 | 7/2007 | Mathew et al. | |
| 7,385,234 B2 | 6/2008 | Gopalakrishnan et al. | |
| 8,258,037 B2* | 9/2012 | Chakravarti et al. | 438/381 |
| 2005/0260812 A1 | 11/2005 | Kapteyn et al. | |
| 2007/0052013 A1* | 3/2007 | Kim et al. | 257/330 |
| 2008/0180883 A1* | 7/2008 | Palusinski et al. | 361/524 |
| 2009/0050972 A1* | 2/2009 | Lindsay et al. | 257/368 |

OTHER PUBLICATIONS

J.E. Jang, et al., "Nanoscale Capacitors Based on Metal-Insulator-Carbon Nanotube-Metal (MICNM) Structures," Proceedings of ESSERDC, Grenoble, France, pp. 545-547 (2005).

* cited by examiner

*Primary Examiner* — Matthew W Such
*Assistant Examiner* — Monica D Harrison
(74) *Attorney, Agent, or Firm* — Vazken Alexanian; Michael J. Chang, LLC

(57) ABSTRACT

Techniques for incorporating nanotechnology into decoupling capacitor designs are provided. In one aspect, a decoupling capacitor is provided. The decoupling capacitor comprises a first electrode; an intermediate layer adjacent to the first electrode having a plurality of nanochannels therein; a conformal dielectric layer formed over the intermediate layer and lining the nanochannels; and a second electrode at least a portion of which is formed from an array of nanopillars that fill the nanochannels in the intermediate layer. Methods for fabricating the decoupling capacitor are also provided, as are semiconductor devices incorporating the decoupling capacitor design.

19 Claims, 4 Drawing Sheets

200

NANOPILLAR DECOUPLING CAPACITOR

CROSS-REFERENCE TO RELATED APPLICATION(S)

This application is a continuation of U.S. application Ser. No. 12/548,298 filed on Aug. 26, 2009, now U.S. Pat. No. 8,258,037, the disclosure of which is incorporated by reference herein.

FIELD OF THE INVENTION

The present invention relates to decoupling capacitors, and more particularly, to techniques for incorporating nanotechnology into decoupling capacitor designs.

BACKGROUND OF THE INVENTION

Decoupling capacitors are commonly employed in integrated circuit designs to reduce noise interference. As a general rule, an increase in capacitance density is desirable, and chip designers are often faced with the difficult task of trying to achieve the largest capacitance possible for a fixed design area on a chip. This challenge is further exacerbated by current trends towards smaller feature sizes in circuit designs. Thus, the available design areas are also shrinking in size.

Therefore, techniques that increase the capacitance density for a fixed design area on a chip, would be desirable.

SUMMARY OF THE INVENTION

The present invention provides techniques for incorporating nanotechnology into decoupling capacitor designs. In one aspect of the invention, a decoupling capacitor is provided. The decoupling capacitor comprises a first electrode; an intermediate layer adjacent to the first electrode having a plurality of nanochannels therein; a conformal dielectric layer formed over the intermediate layer and lining the nanochannels; and a second electrode at least a portion of which is formed from an array of nanopillars that fill the nanochannels in the intermediate layer.

In another aspect of the invention, a method for fabricating a decoupling capacitor is provided. The method comprises the following steps. A first electrode is formed. An intermediate layer is formed adjacent to the first electrode, the intermediate layer having a plurality of nanochannels therein. A conformal dielectric layer is deposited over the intermediate layer and lining the nanochannels. A second electrode is formed at least a portion of which comprises an array of nanopillars that fill the nanochannels in the intermediate layer.

In yet another aspect of the invention, a semiconductor device is provided. The semiconductor device comprises a substrate; a circuit layer adjacent to the substrate; and a decoupling capacitor adjacent to at least a portion of the circuit layer. The decoupling capacitor comprises a first electrode adjacent to the circuit layer; an intermediate layer adjacent to the first electrode having a plurality of nanochannels therein; a conformal dielectric layer formed over the intermediate layer and lining the nanochannels; and a second electrode at least a portion of which is formed from an array of nanopillars that fill the nanochannels in the intermediate layer.

A more complete understanding of the present invention, as well as further features and advantages of the present invention, will be obtained by reference to the following detailed description and drawings.

DETAILED DESCRIPTION OF PREFERRED EMBODIMENTS

Figure 1A:
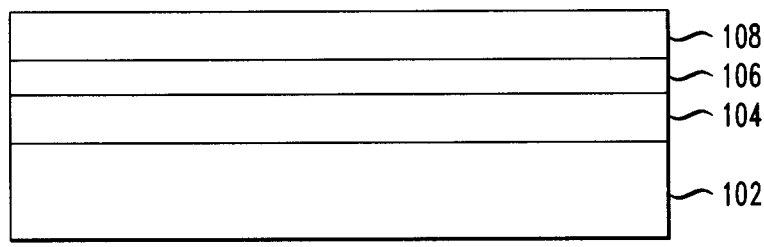
FIGS. 1A-E are cross-sectional diagrams illustrating an exemplary methodology for fabricating a semiconductor device according to an embodiment of the present invention.

FIGS. 1A-E are cross-sectional diagrams illustrating an exemplary methodology for fabricating a semiconductor device having a nanopillar-based decoupling capacitor. As shown in FIG. 1A, a substrate 102 is provided. A variety of known substrate configurations can be used. For example, substrate 102 can comprise a bulk silicon (Si) substrate or a silicon-on-insulator (SOI) wafer. One or more integrated circuit elements (such as logic and/or memory transistors) can be formed on substrate 102 using standard front-end-of-line (FEOL) processing. These elements are represented schematically by circuit layer 104 adjacent to substrate 102. A first electrode 106 is then formed adjacent to a side of circuit layer 104 opposite substrate 102. According to an exemplary embodiment, first electrode 106 comprises a metal, such as titanium nitride (TiN) and/or tungsten (W), and is deposited using methods such as plasma vapor deposition (PVD) or atomic layer deposition (ALD), to a thickness of from about five nanometers (nm) to about 20 nm. While FIG. 1A depicts the first electrode being formed over a circuit layer, this configuration is exemplary and merely shown for illustrative purposes. Namely, fabrication of the present nanopillar-based decoupling capacitor can begin with the formation of the first electrode layer on any relevant layer/surface.

An intermediate layer 108 is then formed adjacent to a side of first electrode 106 opposite circuit layer 104. According to an exemplary embodiment, intermediate layer 108 comprises a layer of amorphous Si which is deposited using chemical vapor deposition (CVD) to a thickness of about 500 nm. As a result, each nanochannel formed therein (see below) will also have a height h of about 500 nm.

An optional ion implant into intermediate layer 108 may be used to increase the conductivity of intermediate layer 108. According to an exemplary embodiment, boron (B) ions are implanted into intermediate layer 108, i.e., using an ion implanter.

Figure 1B:
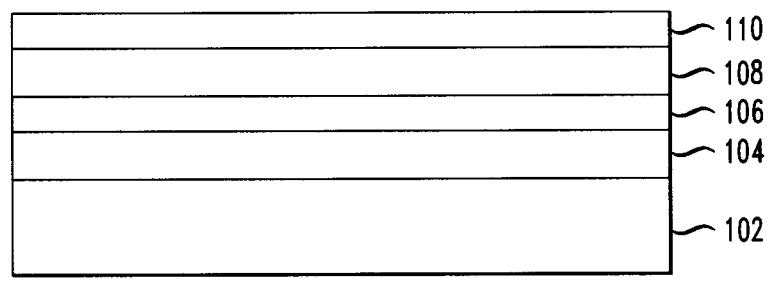

As shown in FIG. 1B, a copolymer layer 110 is formed over a side of intermediate layer 108 opposite first electrode 106. According to an exemplary embodiment, copolymer layer 110 comprises a diblock copolymer, such as a random copolymer of polystyrene (PS) and poly(methyl methacrylate) (PMMA) (abbreviated as PS-ran-PMMA) or a PS-block-PMMA copolymer (abbreviated as PS-b-PMMA), and is spin-coated onto intermediate layer 108 (i.e., so as to form a self-aligned layer/film) to a thickness of from about 20 nm to about 80 nm. The diblock copolymer can be spin-coated onto intermediate layer 108 at about 1,000 revolutions per minute (RPM) to attain adequate coverage.

Figure 1C:
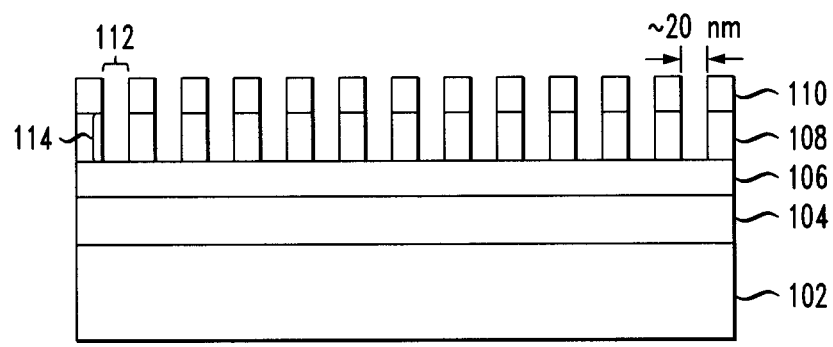

As shown in FIG. 1C, copolymer layer 110 is then processed to create a mask that is used in the formation of nanochannels in intermediate layer 108. According to an exemplary embodiment, annealing is used to form nanopores 112 in copolymer layer 110, through which conventional reactive ion etching (RIE) is used to etch nanochannels 114 in intermediate layer 108. By way of example only, the nanopores formed can have an average diameter of about 20 nm and can be spaced on average about 40 nm from one another (see below). According to an exemplary embodiment, the assembly is annealed at a temperature of from about 150 degrees Celsius (° C.) to about 180° C. for a duration of about 48 hours to promote the nanopore formation. The surface of copolymer layer 110 can then be rinsed, e.g., in toluene, to remove unattached chains. Since the nanochannels are formed through the 'nanopore mask,' the nanochannels formed in intermediate layer 108 will similarly each have a diameter of about 20 nm.

Figure 1D:
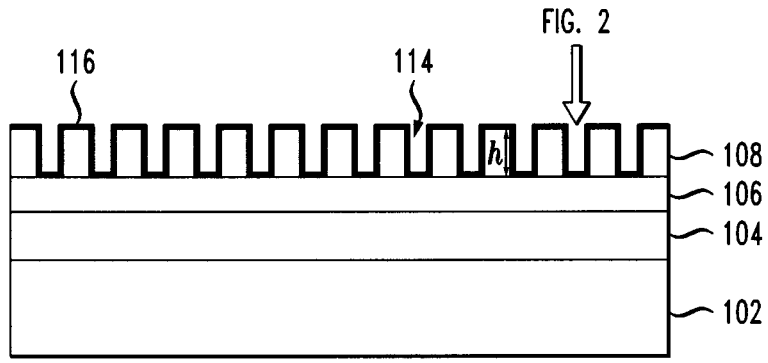

As shown in FIG. 1D, copolymer layer 110 is removed. According to an exemplary embodiment, copolymer layer 110 is removed using a two step removal process. In the first step, the assembly is exposed to a downstream hydrogen ($H_2$) or forming gas plasma for a length of time of from about 30 seconds to about two minutes at a temperature of from about 75° C. to about 100° C. so as to weaken the copolymer to make the copolymer more hydrophilic. In the second step, a wet etch is performed with standard SC1 ($H_2O$:$H_2O_2$:$NH_4OH$ in volume ratio of from about 5:1:1 to about 7:2:1) for a length of time of from about two minutes to about five minutes at either room temperature or at a temperature of from about 50° C. to about 75° C. Alternatively, in the second step, supercritical carbon dioxide ($CO_2$) can be used (with or without a co-solvent, such as five percent (%) toluene) to dissolve or cause a swelling of the weakened copolymer and to detach/remove the copolymer.

Each resulting nanochannel 114 in intermediate layer 108 can have a height h of about 500 nm (based for example on the thickness of intermediate layer 108, as highlighted above). A conformal dielectric layer 116 is then deposited over, and lining nanochannels 114 in intermediate layer 108. Conformal dielectric layer 116 can comprise any insulator material, including, but not limited to, silicon dioxide ($SiO_2$) or a high-k dielectric material. According to an exemplary embodiment, conformal dielectric layer 116 is deposited over intermediate layer 108 using CVD to an equivalent oxide thickness (EOT) of from about one nm to about five nm. Conformal dielectric layer 116 will serve as an insulator layer between the first electrode and a second (nanopillar-based) electrode (see below). A top-down view of one of the nanochannels formed is shown in FIG. 2, described below.

Figure 1E:
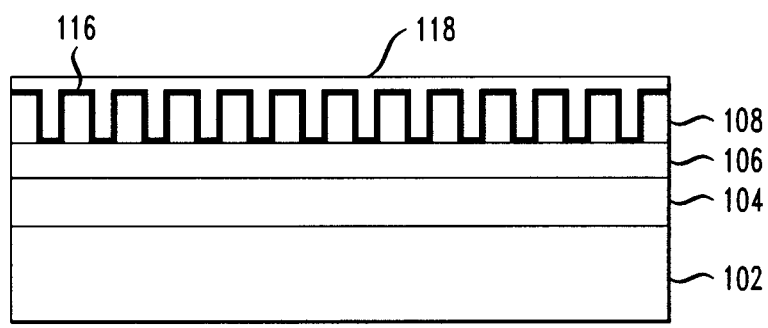

As shown in FIG. 1E, a second electrode 118 is formed over, and filling nanochannels 114 in, intermediate layer 108. Second electrode 118 is separated from intermediate layer 108 by conformal dielectric layer 116. According to one exemplary embodiment, second electrode 118 comprises a high-k metal such as TiN and is deposited over intermediate layer 108 using PVD. According to another exemplary embodiment, second electrode 118 comprises amorphous Si and is deposited over intermediate layer 108 using CVD. The portions of second electrode 118 that fill nanochannels 114 form nanopillars, collectively referred to herein as a nanopillar array, each nanopillar having a height and diameter corresponding to the height and diameter of each nanochannel, e.g., a height of about 500 nm and a diameter of about 20 nm.

An advantage of the present nanopillar-based decoupling capacitor is that a larger capacitance can be formed by enlarging the effective capacitor for the same device area. Namely, the vertical and horizontal areas created by the nanopillar array structure are both effective decoupling areas.

Figure 2:
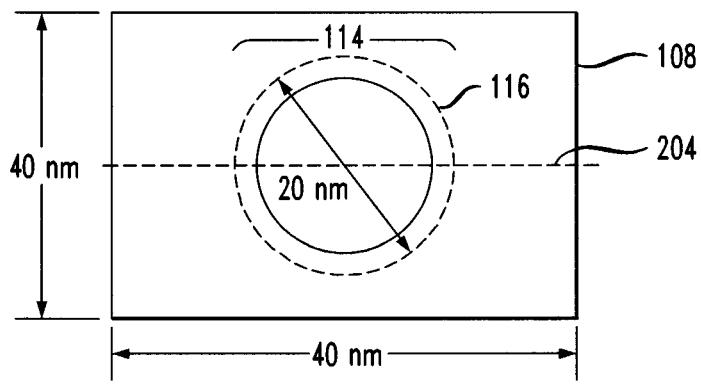
FIG. 2 is an enlarged top-down view of a conformal dielectric lined nanochannel according to an embodiment of the present invention.

FIG. 2 is an enlarged top-down view 200 of one of the conformal dielectric lined nanochannels 114. See, for example, FIG. 1D, described above. For ease of depiction, the dielectric layer, i.e., dielectric layer 116 (see above), that would be deposited on top of intermediate layer 108 has been omitted. However, the portion of dielectric layer 116 that lines nanochannel 114 is shown. From the above description, it is apparent that nanochannel 114 is a channel etched into intermediate layer 108. For illustrative purposes, reference line 204 is shown. A cross-sectional cut through line 204 is what is represented, for example, in FIG. 1D, described above.

According to the exemplary configuration depicted in FIG. 2, nanochannel 114 is formed having a diameter of about 20 nm. Further, section 200 is shown to be about 40 nm square, which represents an exemplary spacing between adjacent nanochannels (i.e., the spacing from a center of one nanochannel to a center of an adjacent nanochannel).

Figure 3A:
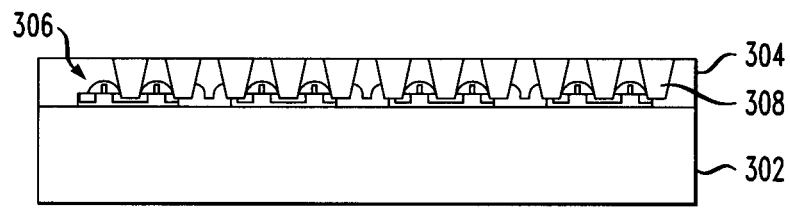
FIGS. 3A-F are cross-sectional diagrams illustrating an exemplary methodology for integrating nanopillar decoupling capacitors into a three-dimensional semiconductor device architecture according to an embodiment of the present invention.

FIGS. 3A-F are cross-sectional diagrams illustrating an exemplary methodology for integrating the present nanopillar-based decoupling capacitors into a three-dimensional semiconductor device architecture. As shown in FIG. 3A, the starting point for the device architecture is a substrate 302 and a circuit layer 304 formed on the substrate. Substrate 302 and circuit layer 304 are representative of substrate 102 and circuit layer 104, respectively, both described in conjunction with the description of FIGS. 1A-E, above. As shown in FIG. 3A, circuit layer 304 contains a plurality of integrated circuit elements, such as logic and/or memory transistors 306 which, as highlighted above, can be formed using standard FEOL processing. In general, each transistor can have a source region and a drain region interconnected by a channel region, and a gate region over the channel region. Structures and processes for forming transistors are well known to those of ordinary skill in the art, and thus are not described further herein. A plurality of vias 308 are formed through circuit layer 304, and will serve to connect one or more of transistors 306 to the decoupling capacitor (see below). Structures and processes for forming vias are well known to those of ordinary skill in the art, and thus are not described further herein.

Figure 3B:
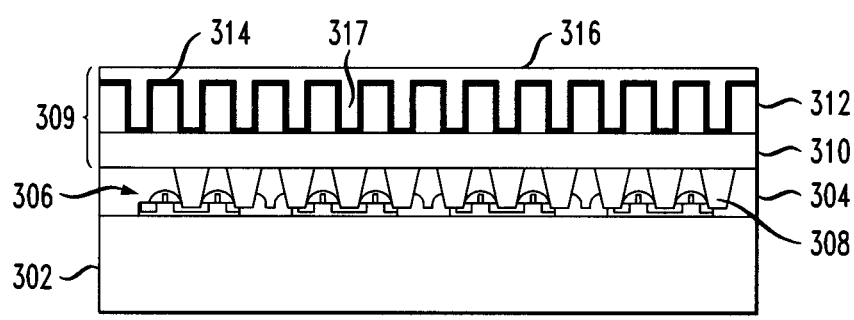

As shown in FIG. 3B, a nanopillar-based decoupling capacitor layer 309 is formed adjacent to circuit layer 304. Nanopillar-based decoupling capacitor layer 309 is formed using the steps described in conjunction with the description of FIGS. 1A-E, above. Thus, nanopillar-based decoupling capacitor layer 309 comprises a first electrode 310, an intermediate layer 312 having a plurality of nanochannels formed therein, a conformal dielectric layer 314 covering intermediate layer 312 and lining the nanochannels and a second electrode 316 having nanopillars 317 (collectively a nanopillar array) that fill the nanochannels in intermediate layer 312. As shown in FIG. 3B, vias 308 interconnect transistors 306 to first electrode 310 of the decoupling capacitor.

In general, back-end-of-line (BEOL) processing is used to form and integrate the nanopillar-based decoupling capacitor into the device architecture. Further, according to the integration scheme shown in FIGS. 3A-F, the nanopillar-based decoupling capacitor is being integrated into a first metal layer, i.e., M1, of the device. However, the techniques presented herein can be used to integrate a nanopillar-based decoupling capacitor(s) into any of the metal layers, i.e., MX, in a given device architecture.

Figure 3C:
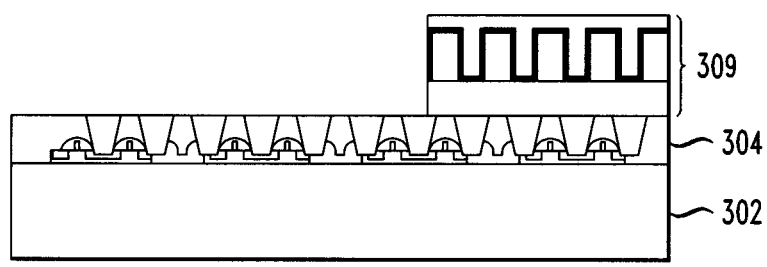

As shown in FIG. 3C, a portion of nanopillar-based decoupling capacitor layer 309 is removed from areas that do not need a capacitor. According to an exemplary embodiment, a hardmask layer is deposited over nanopillar-based decoupling capacitor layer 309 and patterned with the locations from which the nanopillar-based decoupling capacitor layer is to be removed. RIE is then used to remove portions of the nanopillar-based decoupling capacitor layer from the select locations.

Figure 3D:
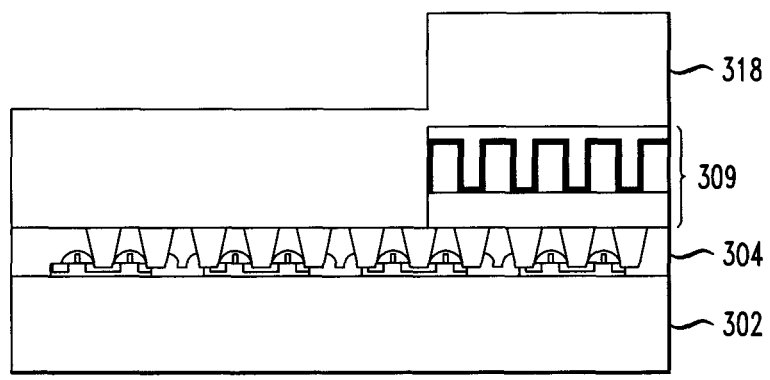
Figure 3E:
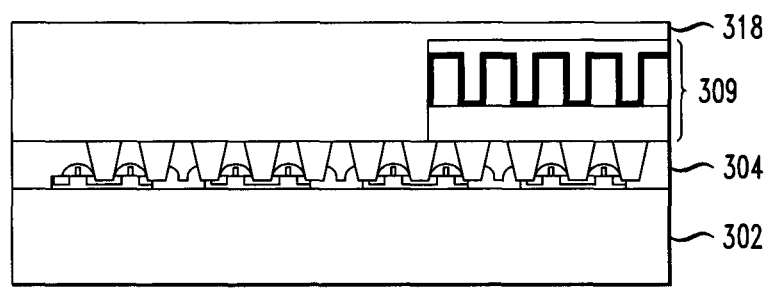

As shown in FIG. 3D, an insulator layer 318 is deposited over circuit layer 304/nanopillar-based decoupling capacitor layer 309. According to an exemplary embodiment, insulator layer 318 comprises a standard BEOL insulator material, such as borophosphosilicate glass (BPSG). As shown in FIG. 3E, the surface of insulator layer 318 is planarized using, for example, chemical-mechanical polishing (CMP).

Figure 3F:
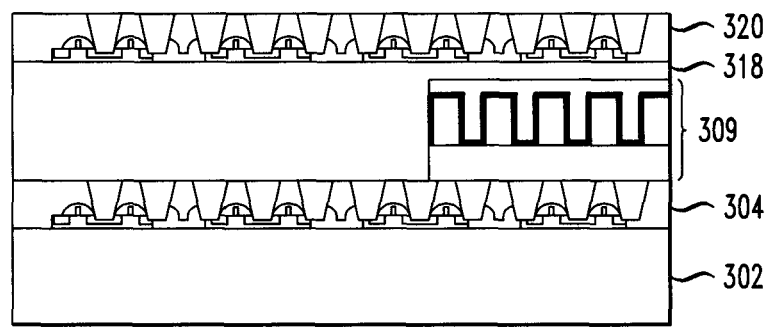

As shown in FIG. 3F, processing can then be continued to higher metal levels. For example, additional layers, such as circuit layer 320, can be integrated into the device stack. As well, additional nanopillar-based decoupling capacitor layers can be added, as needed (not shown).

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A decoupling capacitor, comprising:
   a first electrode;
   an intermediate layer adjacent to the first electrode having a plurality of nanochannels therein, wherein the intermediate layer comprises an amorphous silicon layer;
   a conformal dielectric layer formed over the intermediate layer and lining a bottom and sidewalls of each of the nanochannels; and
   a second electrode at least a portion of which is formed from an array of nanopillars that fill the nanochannels in the intermediate layer, wherein each nanopillar in the nanopillar array is separated from the intermediate layer by the conformal dielectric layer.

2. The decoupling capacitor of claim 1, wherein the first electrode is formed from one or more of titanium nitride and tungsten.

3. The decoupling capacitor of claim 1, wherein each nanopillar in the nanopillar array has a height of about 500 nanometers.

4. The decoupling capacitor of claim 1, wherein each nanopillar in the nanopillar array has a diameter of about 20 nanometers.

5. The decoupling capacitor of claim 1, wherein the conformal dielectric layer comprises one or more of silicon dioxide and a high-k dielectric material.

6. The decoupling capacitor of claim 1, wherein the second electrode comprises a high-k metal.

7. The decoupling capacitor of claim 1, wherein the second electrode comprises amorphous silicon.

8. A method for fabricating a decoupling capacitor, comprising the steps of:
   forming a first electrode;
   forming an intermediate layer adjacent to the first electrode having a plurality of nanochannels therein, wherein the intermediate layer comprises an amorphous silicon layer;
   depositing a conformal dielectric layer over the intermediate layer and lining a bottom and sidewalls of each of the nanochannels; and
   forming a second electrode at least a portion of which comprises an array of nanopillars that fill the nanochannels in the intermediate layer, wherein each nanopillar in the nanopillar array is separated from the intermediate layer by the conformal dielectric layer.

9. The method of claim 8, further comprising the step of:
   implanting ions into the intermediate layer.

10. The method of claim 9, wherein the ions implanted into the intermediate layer comprise boron ions.

11. The method of claim 8, further comprising the steps of:
   forming a copolymer layer over the intermediate layer;
   forming nanopores in the copolymer layer;
   etching through the nanopores in the copolymer layer to form the nanochannels in the intermediate layer; and
   removing the copolymer layer.

12. The method of claim 11, wherein the copolymer layer comprises a diblock copolymer.

13. The method of claim 12, wherein the diblock copolymer is a random copolymer of polystyrene and poly(methyl methacrylate) or a polystyrene-block-poly(methyl methacrylate) copolymer.

14. The method of claim 11, wherein the copolymer layer is spin-coated onto the intermediate layer.

15. The method of claim 11, wherein the step of forming nanopores in the copolymer layer, further comprises the step of:
   annealing the copolymer layer at a temperature of from about 150° C. to about 180° C. for a duration of about 48 hours.

16. The method of claim 8, wherein the decoupling capacitor is formed over a circuit layer, the method further comprising the step of:
   selectively removing at least one portion of the decoupling capacitor from over one or more areas of the circuit by patterning through a hardmask.

17. A semiconductor device, comprising:
   a substrate;
   a circuit layer adjacent to the substrate;
   a decoupling capacitor adjacent to at least a portion of the circuit layer, the decoupling capacitor comprising:
       a first electrode adjacent to the circuit layer;
       an intermediate layer adjacent to the first electrode having a plurality of nanochannels therein, wherein the intermediate layer comprises an amorphous silicon layer;
       a conformal dielectric layer formed over the intermediate layer and lining a bottom and sidewalls of each of the nanochannels; and
       a second electrode at least a portion of which is formed from an array of nanopillars that fill the nanochannels in the intermediate layer, wherein each nanopillar in the nanopillar array is separated from the intermediate layer by the conformal dielectric layer.

18. The semiconductor device of claim 17, wherein the circuit layer comprises one or more transistors.

19. The semiconductor device of claim 18, wherein the circuit layer comprises one or more vias connecting one or more of the transistors to the decoupling capacitor.

* * * * *